(12) United States Patent
Huang et al.

(10) Patent No.: US 8,710,857 B2
(45) Date of Patent: Apr. 29, 2014

(54) HIGH FREQUENCY VERTICAL SPRING PROBE

(75) Inventors: Cheng-Lung Huang, Hsinchu County (TW); Pou-Huang Chen, Changhua County (TW); Hsing-Lung Chen, Hsinchu (TW)

(73) Assignee: Probeleader Co., Ltd., Xiangshan Dist., Hsinchu (TW)

( * ) Notice: Subject to any disclaimer, the term of this patent is extended or adjusted under 35 U.S.C. 154(b) by 386 days.

(21) Appl. No.: 13/077,986

(22) Filed: Apr. 1, 2011

(65) Prior Publication Data

US 2011/0241715 A1 Oct. 6, 2011

(30) Foreign Application Priority Data

Apr. 2, 2010 (TW) .............................. 99110383 A
Dec. 6, 2010 (TW) .............................. 99142317 A

(51) Int. Cl.
*G01R 31/00* (2006.01)
(52) U.S. Cl.
USPC ..................................................... 324/755.05
(58) Field of Classification Search
USPC .............. 324/754.04, 755.04–755.08, 755.01
See application file for complete search history.

(56) References Cited

U.S. PATENT DOCUMENTS

| 4,773,877 | A | * | 9/1988 | Kruger et al. ................. 439/482 |
| 5,667,410 | A | * | 9/1997 | Johnston ....................... 439/700 |
| 6,784,680 | B2 | * | 8/2004 | Haga et al. .............. 324/750.25 |
| 7,190,179 | B2 | * | 3/2007 | Haga et al. .............. 324/755.05 |
| 7,270,550 | B1 | * | 9/2007 | Peng ............................... 439/66 |
| 7,928,751 | B2 | * | 4/2011 | Hsu .......................... 324/756.04 |
| 7,955,122 | B2 | * | 6/2011 | Tominaga et al. ............ 439/482 |
| RE42,637 | E | * | 8/2011 | Mochizuki et al. ...... 324/755.08 |
| 2005/0110505 | A1 | * | 5/2005 | Tsui et al. ..................... 324/754 |
| 2008/0036484 | A1 | * | 2/2008 | Lee ................................ 324/761 |
| 2010/0033201 | A1 | * | 2/2010 | Hsu et al. ...................... 324/761 |
| 2011/0050263 | A1 | * | 3/2011 | Sato et al. ................ 324/755.05 |

FOREIGN PATENT DOCUMENTS

CN 101345360 A 1/2009

* cited by examiner

*Primary Examiner* — Patrick Assouad
*Assistant Examiner* — Demetrius Pretlow
(74) *Attorney, Agent, or Firm* — Winston Hsu; Scott Margo

(57) ABSTRACT

A high frequency vertical spring probe is provided in the present invention. The probe includes an unclosed ring structure having a gap disposed therein to provide an elastic property for vertical deformation. At least a first contacting component and a second contacting component are disposed on the ring structure of the probe to provide electrical connection of an external component when the probe is compressed. The first contacting component is located near two terminals of the ring structure adjacent to the gap and the second contacting component is disposed vertically corresponding to the first contacting component. The probe can serve as the electrical connection between two components or can be installed in the probe card to provide chip testing with high-frequency, high-speed and good-contacting environment.

5 Claims, 11 Drawing Sheets

HIGH FREQUENCY VERTICAL SPRING PROBE

BACKGROUND OF THE INVENTION

1. Field of the Invention

The present invention relates to a probe structure, and more particularly, to a micro probe structure which can be applied to a high-frequency and high-speed chip testing apparatus, and also can provide an elastic property for vertical deformation to maintain good contact during the testing condition.

2. Description of the Prior Art

The probe card is mainly utilized in testing wafer dies. The probe card uses a plurality of probes to contact the wafer die and with the associated test apparatus and the control of software, the testing of wafer dies is executed to screen out defective products which can be restored or discarded. Consequently, the subsequent packaging can be carried out and the yield of the products can be upgraded.

Along with the development of semiconductor technology and the miniaturization of the critical dimension of integrated circuits, the original cantilever probes, which have bending tips and are operated laterally, are gradually replaced by vertical probes with a smaller tip diameter and greater tip density. In terms of fabricating technology, the vertical probes can be classified into categories including: the spring-probes formed by mechanical processes, the probes with various geometric cross-section shapes formed by chemical etching, the multi-layered probes formed by micro-electrical-mechanical system (MEMS) processes, and the micro probes formed by Lithographie GaVanoformung Abformung (LIGA) processes. The LIGA process is, for example, represented in the Taiwan Patent number TWI284209 of the Industrial Technology Research Institute, "A METHOD OF FABRICATING VERTICAL PROBE HEAD." Currently, various kinds of elastic bending structures are developed in the middle portion of the probes in a vertical probe card to attain vertical elastic properties when the probes are being contacted. Accordingly, the inventor is devoted to design an alternative probe structure.

SUMMARY OF THE INVENTION

One objective of the present invention is to provide a high frequency vertical spring probe with a novel micro probe structure which can be utilized in a high-frequency and high-speed testing apparatus.

Another objective of the present invention is to provide a high frequency vertical spring probe structure wherein the probe can serve as an electrical conductive medium between two components such as two circuit boards.

To achieve the above objectives, the probe in the present invention includes an unclosed ring structure having a gap disposed therein to provide an elastic property for vertical deformation. At least a first contacting component and a second contacting component are disposed on the ring structure of the probe to provide electrical connection of an external component when the probe is compressed. The first contacting component is located near two terminals of the ring structure adjacent to the gap and the second contacting component is disposed vertically corresponding to the first contacting component.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
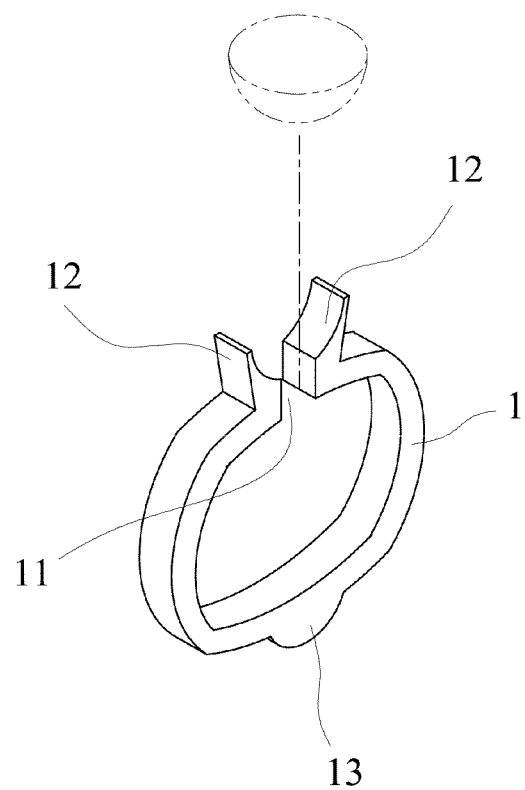
FIG. 1 illustrates a three-dimensional schematic diagram of the high frequency vertical spring probe according to the first embodiment in the present invention.

Please refer to FIG. 1, illustrating a three-dimensional schematic diagram of the high frequency vertical spring probe according to the first embodiment in the present invention. As shown in FIG. 1, the probe 1 has an unclosed ring structure to provide an elastic property for vertical deformation. In one embodiment, a gap 11 is formed in the unclosed ring structure of the probe 1. The ring structure of the probe 1 has a mirror-symmetrical shape which constitutes more than one arc ring bodies having different diameters. However, the shape of the ring structure is not limited to an arc ring, but can be other geometric shapes, such as elliptic ring, diamond ring or other irregular rings. The probe 1 is preferably made of metal with good electrical conductivity. In one embodiment, a height of the probe 1 is less than the maximum width of the probe 1. That is, the distance between the top surface and the bottom surface of the probe 1 in FIG. 1 is less than that between the left side surface and the right side surface. Accordingly, a better flexibility and resilience can be provided when the probe 1 is compressed in the vertical direction. The probe 1 further includes at least a first contacting component 12 and a second contacting component 13, which are disposed on the peripheral region of the ring structure of the probe 1. The first contacting component 12 and the second contacting component 13 are utilized as electrical contacting points to external components when the probe 1 is compressed. The first contacting component 12 is located near two terminals of the ring structure adjacent to the gap 11. The second contacting component 13 is located on the peripheral region of the probe 1 and is vertically corresponding to the first contacting component 12. Since the probe 1 in the present invention is special and sophisticated, the probe 1 is preferably fabricated by the LIGA method, which is able to meet the structure as shown in FIG. 1.

In the present invention, the first contacting component 12 and the second contacting component 13 are utilized in the probe 1 to electrically contact with external components such as circuit boards. In order to maintain good contact properties and high electrical transmitting ability, different embodiments are proposed in the present invention. As shown in FIG. 1, the first contacting component 12 in the present embodiment protrudes from an outer surface of the ring structure of the probe 1 in which two first contacting components 12 are respectively disposed on two terminals of the ring structure adjacent to the gap 11. Both the two first contacting components 12 have a tapered arc shape and are facing with each other to form a mirror-symmetrical structure. The distance between the two first contacting components 12 decreases from top to bottom, showing a both-hands-holding-bouquet similar structure. A solder bump, which is shown by the dashed lines in FIG. 1, may have a larger contacting surface when contacting with the first contacting component 12 in the present embodiment, therefore enhancing the transmitting efficiency. The second contacting component 13, which may has an arc shape, protrudes from the outer surface of the probe 1 and corresponds to the first contacting component 12 in the vertical direction. In one embodiment, the number of the second contacting component 13 can be more than one.

Figure 2:
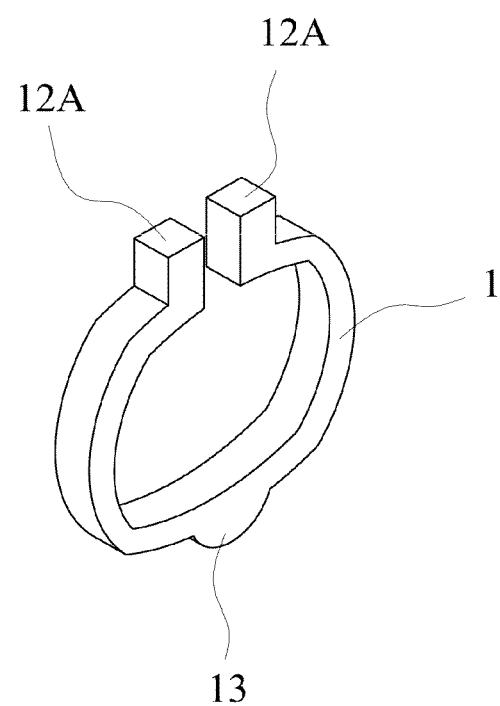
FIG. 2 illustrates a three-dimensional schematic diagram of the high frequency vertical spring probe according to the second embodiment in the present invention.

Please refer to FIG. 2, illustrating a schematic diagram of the high frequency vertical spring probe according to the second embodiment in the present invention. As shown in FIG. 2, the first contacting components 12A protrudes from the outer surface of the ring shape of the probe 1. Two first contacting components 12A are respectively disposed on two terminals of the ring structure adjacent to the gap 11, facing to each other. The shape of the first contacting component 12A in the present embodiment may be a cuboid. The shape and the feature of the second contacting component 13 are similar to those in the first embodiment shown in FIG. 1.

Figure 3:
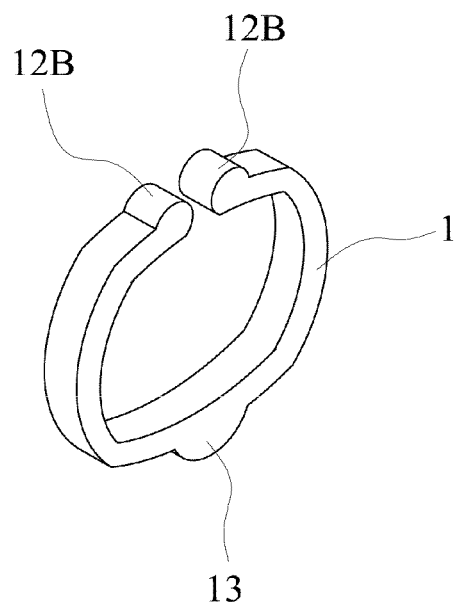
FIG. 3 illustrates a three-dimensional schematic diagram of the high frequency vertical spring probe according to the third embodiment in the present invention.

Please refer to FIG. 3, illustrating a schematic diagram of the high frequency vertical spring probe according to the third embodiment in the present invention. As shown in FIG. 3, the first contacting component 12B protrudes from the outer surface of the ring shape of the probe 1. Two first contacting components 12B are respectively disposed on two terminals of the ring structure adjacent to the gap 11, facing to each other. The shape of the first contacting component 12B in the present embodiment may be an arc shape. The shape and the feature of the second contacting component 13 are similar to those in the first embodiment shown in FIG. 1.

Figure 4:
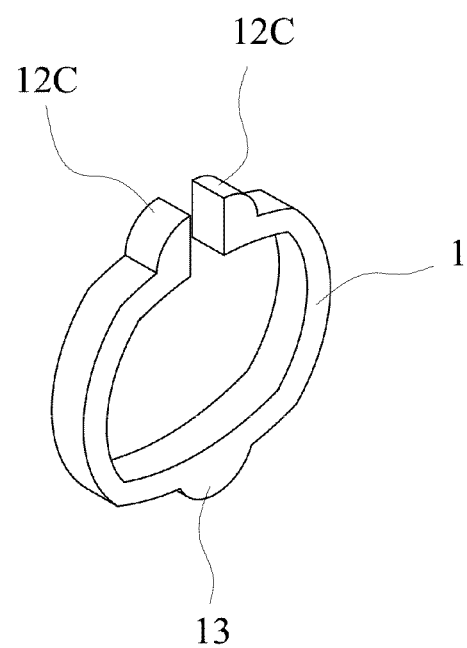
FIG. 4 illustrates a three-dimensional schematic diagram of the high frequency vertical spring probe according to the fourth embodiment in the present invention.

Please refer to FIG. 4, illustrating a schematic diagram of the high frequency vertical spring probe structure according to the fourth embodiment in the present invention. As shown in FIG. 4, the first contacting component 12C protrudes from the outer surface of the ring shape of the probe 1. Two first contacting components 12C are respectively disposed on two terminals of the ring structure adjacent to the gap 11, facing to each other. The shape of the first contacting component 12 in the present embodiment may be a tapered arc shape. The shape of the first contacting components 12C is enlarging from top to bottom, thereby forming the tapered arc shape.

In light of above, the first contacting component and the second contacting component in the probe 1 are not limited to one type but can be other types based on different designs. The main feature is that the structure can provide good contacting environment and good signal transmitting stability when the probe 1 is electrically contacted with external components.

Figure 5:
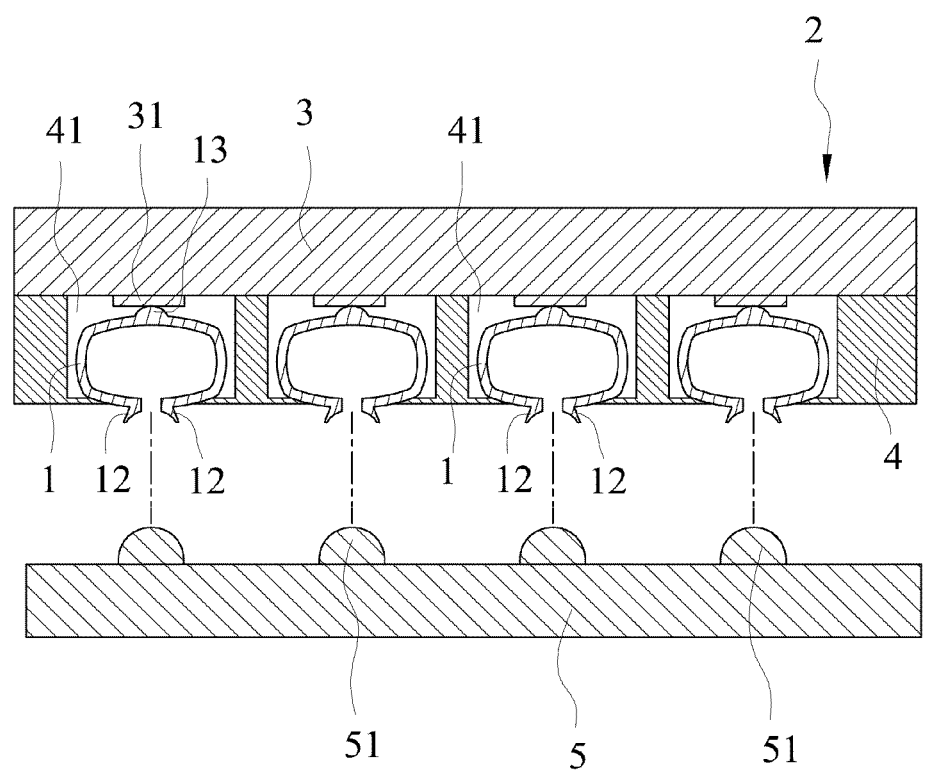
FIG. 5 illustrates a schematic diagram of the high frequency vertical spring probe according to the first embodiment when it is under operation.

Please refer to FIG. 5, illustrating a cross-sectional schematic diagram of the high frequency vertical spring probe of the first embodiment when it is under operation. The probe card 2 includes a circuit board 3, a fixing unit 4 and a plurality of probes 1. The fixing unit 4 is fixed with the circuit board 3. The fixing unit 4 includes a plurality of accommodation spaces 41 where the probes 1 can be installed therein to further restrict the position of the probes 1. The probes 1 can only be compressed vertically but cannot be moved laterally in the accommodation spaces 41. When the probe 1 is fixed, the second contacting component 13 is directly contacting with the metal pad 31 on the circuit board 3 such that the probe 1 is electrically connected with the circuit board 3. When a testing operation is processing, the probe card 2 is moved and the probe 1 is getting close to the test sample 5, which could be a chip or a circuit board for instance. The probe 1 uses the first contacting component 12 to contact the solder ball 51 of the test sample 5 to provide electrical connection and signal transmission.

It is not limited that only the first contacting component 12 of the probe 1 can contact with the test sample 5. In other words, the probe 1 can also be installed inversely to let the second contacting component 13 contact with the test sample 5. In another embodiment, the probe 1 can also be installed between two circuit boards, serving as an electrical transmission medium.

Figure 6:
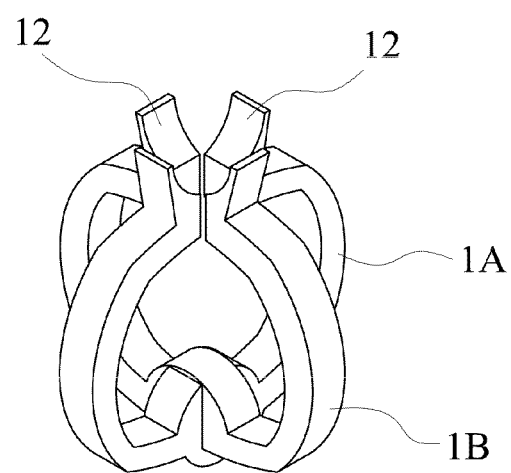
FIG. 6 illustrates a three-dimensional schematic diagram of the high frequency vertical spring probe according to the fifth embodiment in the present invention.
Figure 7:
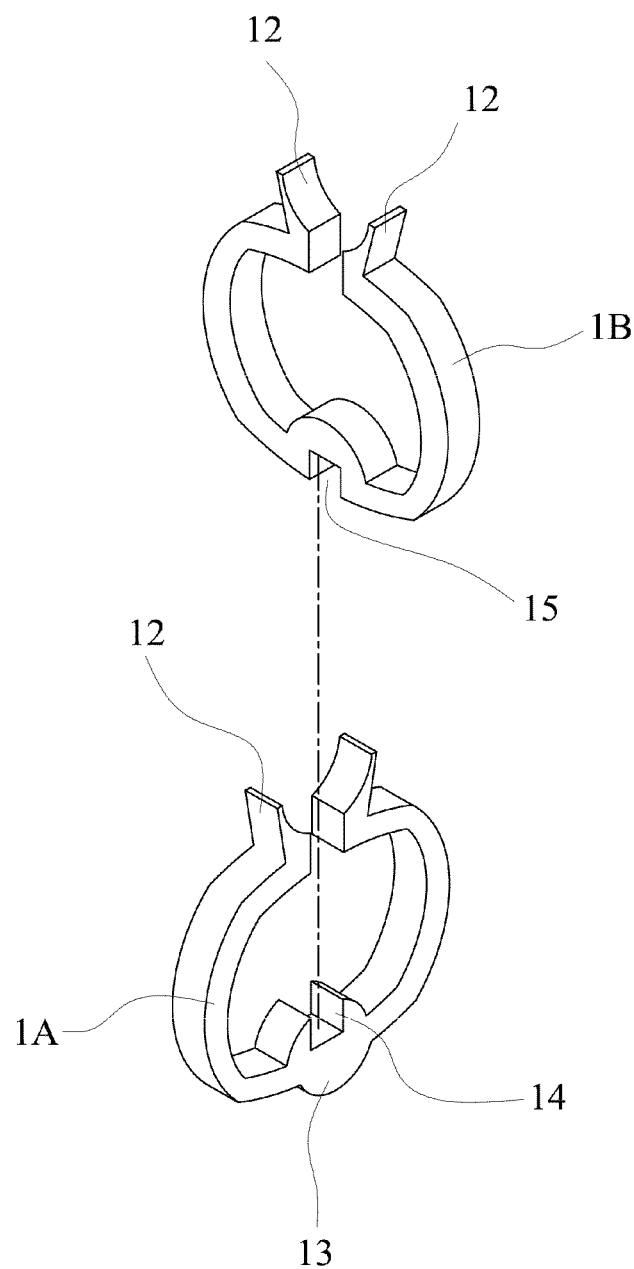
FIG. 7 illustrates an exploded schematic diagram of the high frequency vertical spring probe according to the fifth embodiment in the present invention.
Figure 8:
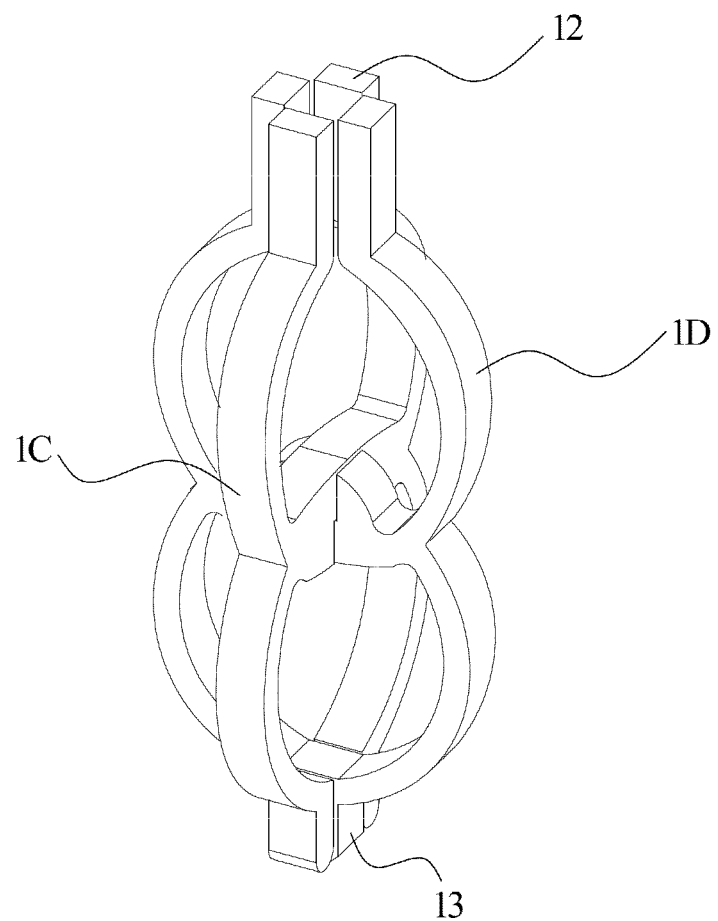
FIG. 8 illustrates a three-dimensional schematic diagram of the high frequency vertical spring probe according to the sixth embodiment in the present invention.
Figure 9:
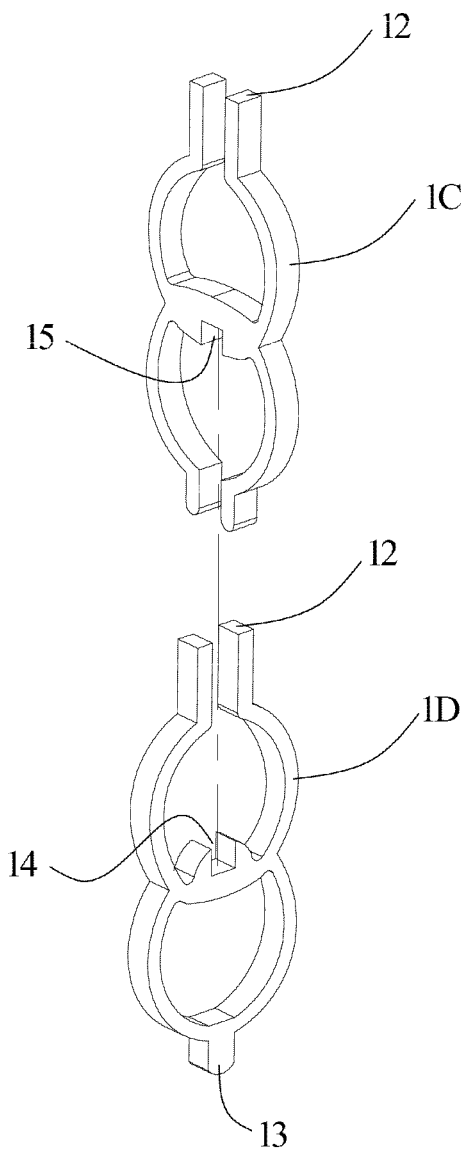
FIG. 9 illustrates an exploded schematic diagram of the high frequency vertical spring probe according to the sixth embodiment in the present invention.

The probe 1 in the present invention is not limited to single usage but can be assembled with one another probe to form a three-dimensional structure. As shown in FIG. 6 and FIG. 7, the three-dimensional structure is formed by interlocking two probes 1A and 1B. The probes 1A and 1B still have unclosed ring structures. In one embodiment, the probe 1A includes the first contacting component 12 and the second contacting component 13, and further includes a binding groove 14 disposed on an inner surface of the ring structure. The probe 1B includes the first contacting component 12, and further includes a holding groove 15. The shape of the binding groove 14 structurally corresponds to that of the holding groove 15 such that the binding groove 14 is engaged with the holding groove 15 when the probe 1A and the probe 1B are assembled in an interlocked manner, forming a three-dimensional structure. As shown in FIG. 8 and FIG. 9, in addition to the above mentioned embodiment which is formed by interlocking the probes to form the three-dimensional structure, in the present embodiment, more than two probes can be vertically stacked and further interlocked with each other to from a three-dimensional structure. The probe 1C and the probe 1D have unclosed ring structure. One difference is that the probe 1C or the probe 1D has a double ring structure formed by vertically stacking and interlocking two probes 1A or 1B. Both the probe 1C and the probe 1D include the first contacting component 12 and the second contacting component 13. A binding groove 14 is disposed on the inner ring surface of the probe 1C while a holding groove 15 is disposed on the inner ring surface of the probe 1D. The shape of the binding groove 14 structurally corresponds to that of the holding groove 15 such that the binding groove 14 is engaged with the holding groove 15 when the probe 1C and the probe 1D are assembled in an interlocked manner, thereby forming a three-dimensional structure.

Figure 10:
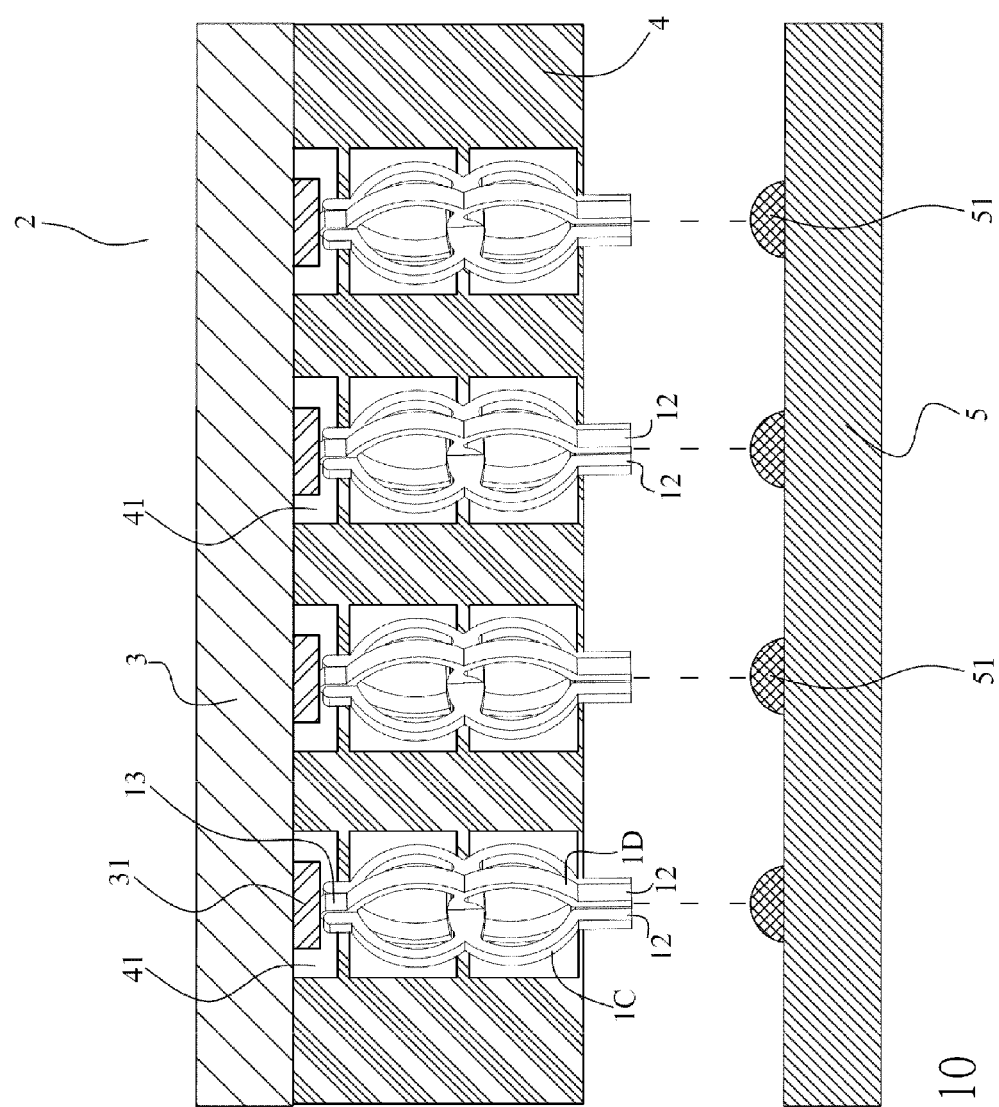
FIG. 10 illustrates a schematic diagram of the high frequency vertical spring probe according to the sixth embodiment when it is under operation.
Figure 10A:
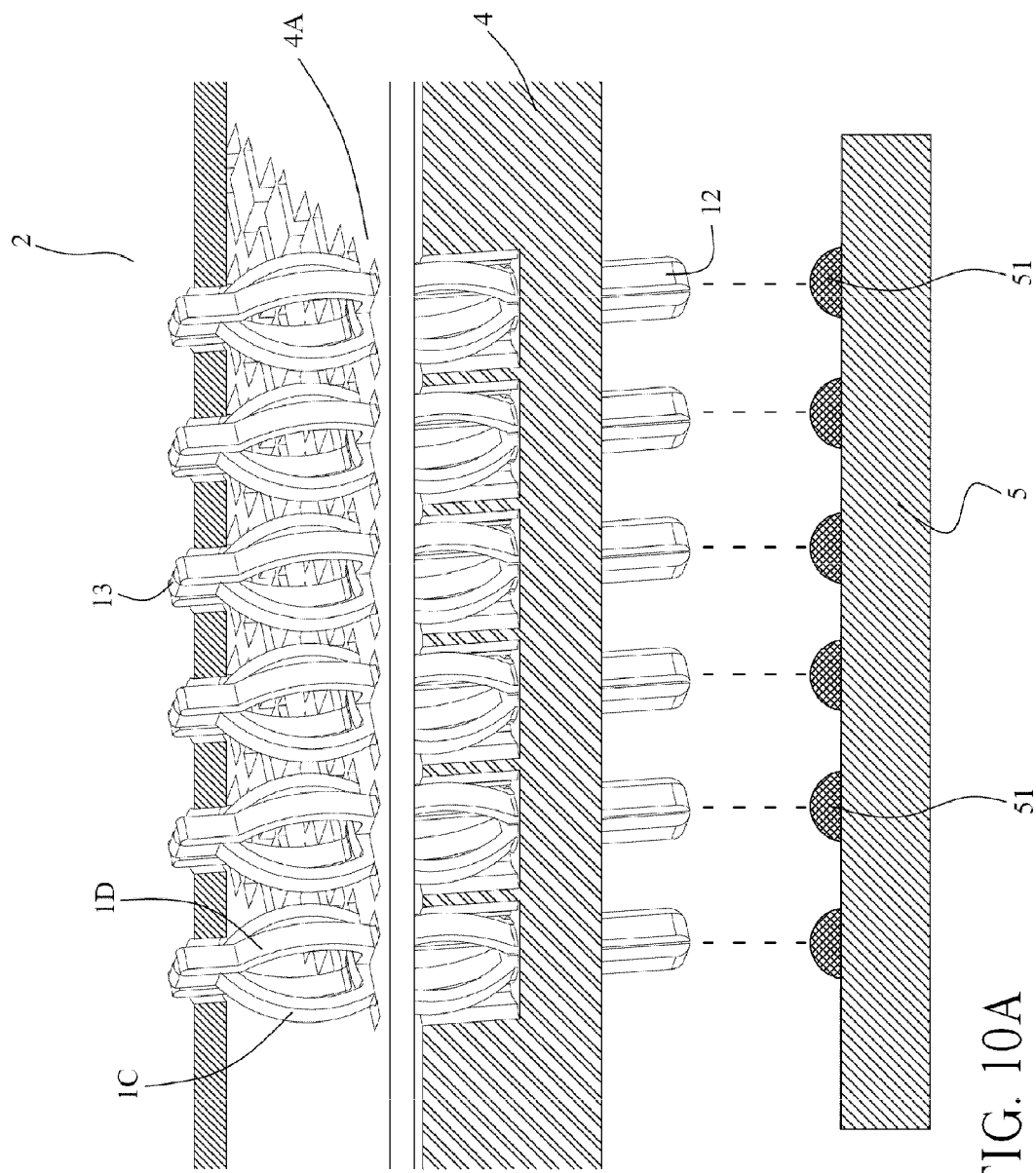
FIG. 10A illustrates a schematic diagram of the fixing unit according to the sixth embodiment when it is under operation.

Please refer to FIG. 10 and FIG. 10A, illustrating schematic diagrams of the high frequency vertical spring probe structure and the fixing unit according to the sixth embodiment of the present invention. The probe card 2 includes a circuit board 3, fixing units 4, 4A and a plurality of probes 1C and 1D. The difference between the first embodiment and the sixth embodiment lies in that the probes 1C and 1D are vertically stacked and interlocked with each other to form a three-dimensional probe structure. The probes 1C and 1D are secured by the fixing unit 4A. In one embodiment, the fixing unit 4A may have cross-shaped openings in order to prevent serious deformation of the interlocking probes when they are compressed and over-rotated. The present embodiment may be similar to the embodiment shown in FIG. 5. For the sake of simplicity, repeated description is omitted.

It is noted that, the shapes of the first contacting component 12, the second contacting component 13 of the probe 1C and the probe 1D, and the fixing component 4A are not limited to the above mentioned descriptions, instead, according to different designs of products, they can be any shapes which can provide good contacting state and good electrical transmission stability when the probe electrically contacts with external components.

Those skilled in the art will readily observe that numerous modifications and alterations of the device and method may be made while retaining the teachings of the invention.

What is claimed is:

1. A high frequency vertical spring probe, wherein the probe comprises an unclosed ring structure having a gap disposed therein to provide an elastic property for vertical deformation, and at least a first contacting component and a second contacting component are disposed on the ring structure of the probe to provide electrical connection of an external component when the probe is compressed, wherein the first contacting component is located near two terminals of the ring structure adjacent to the gap and the second contacting component is disposed vertically corresponding to the first contacting component, wherein at least two probes are assembled in an interlocked manner, and wherein one probe comprises a binding groove disposed on an inner surface of the ring structure, another probe comprises a holding groove disposed on an outer surface of the ring structure, wherein the binding groove of one probe is engaged with the holding groove of another probe when the probes are assembled in the interlocked manner.

2. The high frequency vertical spring probe according to claim 1, wherein the first contacting component and the second contacting component protrude from an outer surface of the ring structure.

3. The high frequency vertical spring probe according to claim 1, wherein the unclosed ring structure of the probe is substantially mirror-symmetrical.

4. The high frequency vertical spring probe according to claim 1, wherein at least two probes are vertically stacked and interlocked with each other to form a first set of probes and at least two probes are vertically stacked and interlocked with each other to form a second set of probes, wherein a binding groove is disposed on the ring structure of the first set of probes and a holding groove is disposed on the ring structure of the second set of probes, and the binding groove of the first set of probes is engaged with the holding groove of the second set of probes when the probes are assembled in the interlocked manner.

5. A high frequency vertical spring probe, wherein the probe comprises an unclosed ring structure having a gap disposed therein to provide an elastic property for vertical deformation, and at least a first contacting component and a second contacting component are disposed on the ring structure of the probe to provide electrical connection of an external component when the probe is compressed, wherein the first contacting component is located near two terminals of the ring structure adjacent to the gap and the second contacting component is disposed vertically corresponding to the first contacting component, wherein at least two probes are vertically stacked and interlocked with each other to form a first set of probes and at least two probes are vertically stacked and interlocked with each other to form a second set of probes, wherein a binding groove is disposed on the ring structure of the first set of probes and a holding groove is disposed on the ring structure of the second set of probes, and the binding groove of the first set of probes is engaged with the holding groove of the second set of probes when the probes are assembled in an interlocked manner.

* * * * *